United States Patent
Yamanaka (12) 
(10) Patent No.: US 9,099,599 B2
(45) Date of Patent: Aug. 4, 2015

(54) SEMICONDUCTOR PHOTO-DETECTION DEVICE AND RADIATION DETECTION APPARATUS

(71) Applicant: Hamamatsu Photonics K.K., Hamamatsu-shi, Shizuoka (JP)

(72) Inventor: Tatsumi Yamanaka, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 103 days.

(21) Appl. No.: 14/055,923

(22) Filed: Oct. 17, 2013

(65) Prior Publication Data
US 2014/0084173 A1    Mar. 27, 2014

Related U.S. Application Data

(63) Continuation of application No. 11/635,025, filed on Dec. 7, 2006, now Pat. No. 8,592,934, which is a continuation of application No. 10/829,385, filed on Apr. 22, 2004, now Pat. No. 7,170,143.

(30) Foreign Application Priority Data

Oct. 20, 2003    (JP) ................................ P2003-359737

(51) Int. Cl.
*H01L 27/146*    (2006.01)
*H01L 31/118*    (2006.01)
(Continued)

(52) U.S. Cl.
CPC ............ *H01L 31/118* (2013.01); *G01T 1/2006* (2013.01); *H01L 27/1446* (2013.01); *H01L 27/1463* (2013.01); *H01L 27/1464* (2013.01); *H01L 27/14661* (2013.01)

(58) Field of Classification Search
CPC .................................................. H01L 27/1463
See application file for complete search history.

(56) References Cited

U.S. PATENT DOCUMENTS 3,703,669 A    11/1972    London
5,537,146 A     7/1996    Tohyama
(Continued)

FOREIGN PATENT DOCUMENTS

EP    0 359 207         3/1990
EP    1 473 553 A1    11/2004
(Continued)

OTHER PUBLICATIONS

Machine translation of Okamoto et al. (JP 2003086827 A).

*Primary Examiner* — Hsin-Yi Hsieh
(74) *Attorney, Agent, or Firm* — Drinker Biddle & Reath LLP (57) ABSTRACT

On the front side of an n-type semiconductor substrate, p-type regions are two-dimensionally arranged in an array. A high-concentration n-type region and a p-type region are disposed between the p-type regions adjacent each other. The high-concentration n-type region is formed by diffusing an n-type impurity from the front side of the substrate so as to surround the p-type region as seen from the front side. The p-type region is formed by diffusing a p-type impurity from the front side of the substrate so as to surround the p-type region and high-concentration n-type region as seen from the front side. Formed on the front side of the n-type semiconductor substrate are an electrode electrically connected to the p-type region and an electrode electrically connected to the high-concentration n-type region and the p-type region.

5 Claims, 8 Drawing Sheets

(51) Int. Cl.
   *H01L 27/144*   (2006.01)
   *G01T 1/20*     (2006.01)

(56) References Cited

U.S. PATENT DOCUMENTS

| | | | |
|---|---|---|---|
| 5,567,974 A | 10/1996 | Yoshitake et al. | |
| 5,831,322 A | 11/1998 | Dabrowski et al. | |
| 5,929,499 A | 7/1999 | Kuhlmann et al. | |
| 6,426,991 B1 | 7/2002 | Mattson et al. | 378/19 |
| 6,510,195 B1 | 1/2003 | Chappo et al. | 378/19 |
| 2001/0004117 A1 | 6/2001 | Chikamatsu et al. | |
| 2003/0034496 A1 | 2/2003 | Yoneta et al. | 257/79 |
| 2004/0113185 A1 | 6/2004 | Shibayama et al. | |

FOREIGN PATENT DOCUMENTS

| | | |
|---|---|---|
| JP | S47-047476 | 11/1972 |
| JP | S61-289677 | 12/1986 |
| JP | S62-074350 | 5/1987 |
| JP | 3-148869 | 6/1991 |
| JP | 03-148869 | 6/1991 |
| JP | H5-067015 | 9/1993 |
| JP | 08-213585 | 8/1996 |
| JP | 11-074553 | 3/1999 |
| JP | 11-150253 | 6/1999 |
| JP | 11-289100 | 10/1999 |
| JP | 2000-012889 | 1/2000 |
| JP | 2001-291892 | 10/2001 |
| JP | 2001-352094 | 12/2001 |
| JP | 2003-004855 | 1/2003 |
| JP | 2003-007993 | 1/2003 |
| JP | 2003-008627 | 1/2003 |
| JP | 2003-086826 | 3/2003 |
| JP | 2003-086827 | 3/2003 |
| JP | 2003-232679 | 8/2003 |
| JP | 2003-232858 | 8/2003 |
| JP | 2003-232859 | 8/2003 |
| JP | 2003-232860 | 8/2003 |
| JP | 2003-232861 | 8/2003 |
| JP | 2003-294846 | 10/2003 |
| JP | 4727422 | 7/2011 |

SEMICONDUCTOR PHOTO-DETECTION DEVICE AND RADIATION DETECTION APPARATUS

This is a continuation application of U.S. application Ser. No. 11/635,025, filed on Dec. 7, 2006, which is a continuation of U.S. application Ser. No. 10/829,385, filed on Apr. 22, 2004, now U.S. Pat. No. 7,170,143 issued on Jan. 30, 2007, each application being incorporated by reference herein.

BACKGROUND OF THE INVENTION

1. Field of the Invention

The present invention relates to a semiconductor photodetector, and a radiation detecting apparatus equipped with the semiconductor photodetector.

2. Related Background Art

Known as this kind of semiconductor photodetector is a backside illumination type photodiode array in which a plurality of photodiodes are formed on one side of a semiconductor substrate, while the other side is used as a light incident surface (see, for example, reference 1: Japanese Patent Application Laid-Open No. HEI 11-74553).

SUMMARY OF THE INVENTION

In the backside illumination type photodiode array, carriers generated in regions other than a depletion layer in the semiconductor substrate migrate by diffusion over a long distance (from the position where they are generated to the depletion layer). Therefore, the probability of carriers generated near between photodiodes flowing into their adjacent photodiodes by migrating upon diffusion without depending on an electric field becomes higher. As a result, crosstalk is more likely to occur between the photodiodes.

Meanwhile, in the backside illumination type photodiode array disclosed in the above-mentioned reference 1, a thin layer for absorbing X-rays is formed between the adjacent photodiodes. However, the thin layer in reference 1 aims at eliminating scattered X-rays, and does not take account of the above-mentioned crosstalk.

In view of the foregoing, it is an object of the present invention to provide a semiconductor photodetector and radiation detecting apparatus which can favorably restrain crosstalk from occurring.

The present invention provides a semiconductor photodetector comprising a semiconductor substrate formed with a plurality of pn junction type photodiodes on a side opposite from an incident surface for light to be detected, wherein a pn junction region is formed between photodiodes adjacent each other in the plurality of photodiodes on the side opposite from the incident surface of the semiconductor substrate.

In the above semiconductor photodetector, since a pn junction region is formed between photodiodes adjacent each other in the plurality of photodiodes on the side opposite from the light incident surface of the semiconductor substrate, carriers which are generated near the adjacent photodiodes and about to flow into the adjacent photodiodes by migrating upon diffusion are drawn from the pn junction region. This eliminates carriers which are about to flow into the adjacent photodiodes by migrating upon diffusion, and thus can favorably restrain crosstalk from occurring between the photodiodes.

In the backside illumination type photodiode array, a photodiode may fall into an electrically floating state when a certain connecting point is damaged because of an initial connection error, a temperature cycle, etc. In this case, carriers overflowing the photodiode may flow into photodiodes thereabout, thus hindering the latter photodiodes from outputting normal signals. Such a phenomenon is not mentioned at all in the backside illumination type photodiode array disclosed in the above-mentioned reference 1.

When a certain photodiode falls into an electrically floating state because of a breakage of a connecting point in the above-mentioned semiconductor photodetector, by contrast, carriers which are about to flow into adjacent photodiodes are drawn from the pn junction region. This can favorably restrain carriers from flowing into the adjacent photodiodes.

Preferably, the pn junction region is formed so as to surround the photodiode as seen from the opposite side. In this case, carriers which are about to flow into the adjacent photodiodes are surely eliminated, so that the occurrence of crosstalk can be suppressed more favorably. Also, even when a certain photodiode falls into an electrically floating state because of a breakage of a connecting point, carriers can more favorably be restrained from flowing into the adjacent photodiodes.

Preferably, a high-concentration impurity semiconductor region having the same conductive type as that of the semiconductor substrate is formed between the pn junction region and the photodiode on the opposite side of the semiconductor substrate. In this case, the high-concentration impurity semiconductor region functions to separate the adjacent photodiodes from each other, whereby the adjacent photodiodes are electrically separated from each other. As a result, the crosstalk between the photodiodes can further be lowered. Also, even when a certain photodiode falls into an electrically floating state because of breakage of a connecting point, carriers can further be restrained from flowing into the adjacent photodiodes.

Preferably, the high-concentration impurity semiconductor region is formed so as to surround the photodiode as seen from the opposite side. This can electrically separate the adjacent photodiodes from each other for sure.

Preferably, an electrode electrically connected to the pn junction region and high-concentration impurity semiconductor region is formed on the opposite side of the semiconductor substrate, and the electrode is connected to a ground potential. In this case, the same electrode is commonly used for connecting the pn junction region to the ground potential and the high-concentration impurity semiconductor region to the ground potential, whereby the number of electrodes can be prevented from increasing. The carriers drawn from the pn junction region disappear within the semiconductor photodetector. As a result, the crosstalk between photodiodes is reduced. Also, even when a certain photodiode falls into an electrically floating state because of a breakage of a connecting point, the flow of carriers into the adjacent photodiodes can be reduced.

Preferably, a first electrode electrically connected to the pn junction region and a second electrode electrically connected to the high-concentration impurity semiconductor region are formed on the opposite side of the semiconductor substrate, whereas the first and second electrodes are connected to respective ground potentials while being electrically insulated from each other. In this case, the pn junction region and the high-concentration impurity semiconductor region are electrically separated from each other within the semiconductor photodetector. This keeps the potential on the pn junction region from fluctuating, and thus can restrain current from flowing in because of the potential difference between the photodiodes and pn junction region. As a result, output signals from photodiodes are less likely to be electrically affected, whereby a stable signal output can be realized.

Preferably, the semiconductor substrate is of a first conductive type, whereas the plurality of photodiodes and pn junction regions are constituted by a second conductive type impurity semiconductor region and the semiconductor substrate. Preferably, the high-concentration impurity semiconductor region is of the first conductive type.

The semiconductor photodetector may be configured such that the opposite side of the semiconductor substrate is formed with respective electrodes, each including a bump electrode, electrically connected to the plurality of photodiodes; the semiconductor photodetector further comprising a support member formed with respective electrode pads, formed on a side facing the semiconductor substrate, corresponding to the plurality of photodiodes; the plurality of photodiodes being electrically connected to the electrode pads corresponding thereto in the support member by way of the respective bump electrodes.

The present invention provides a radiation detecting apparatus comprising the above-mentioned semiconductor photodetector; and a scintillator, positioned on the incident surface side of the semiconductor substrate, emitting light in response to a radiation incident thereon.

The above radiation detecting apparatus employs the above-mentioned semiconductor photodetector, and thus can favorably suppress the occurrence of crosstalk between photodiodes as mentioned above. Also, even when a certain photodiode falls into an electrically floating state because of a breakage of a connecting point, carriers can more favorably be restrained from flowing into the adjacent photodiodes. As a result, a high resolution can be attained.

DESCRIPTION OF THE PREFERRED EMBODIMENTS

The semiconductor photodetector and radiation detecting apparatus in accordance with embodiments of the present invention will be explained with reference to the drawings. In the explanation, constituents identical to each other and those having functions identical to each other will be referred to with numerals or letters identical to each other without repeating their overlapping descriptions.

First Embodiment

Figure 1:
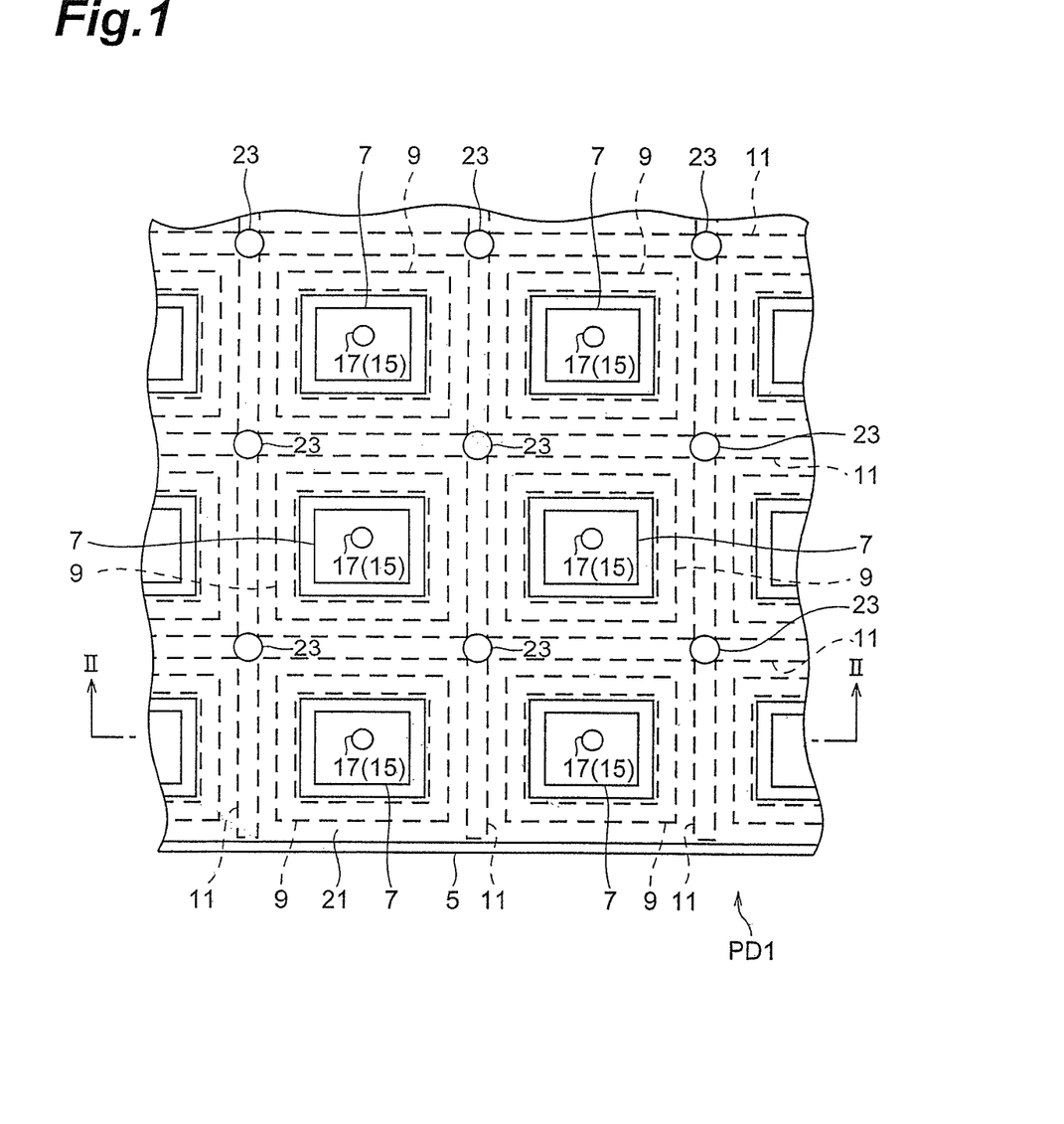
FIG. 1 is a schematic plan view showing the semiconductor photodetector in accordance with a first embodiment.
Figure 2:
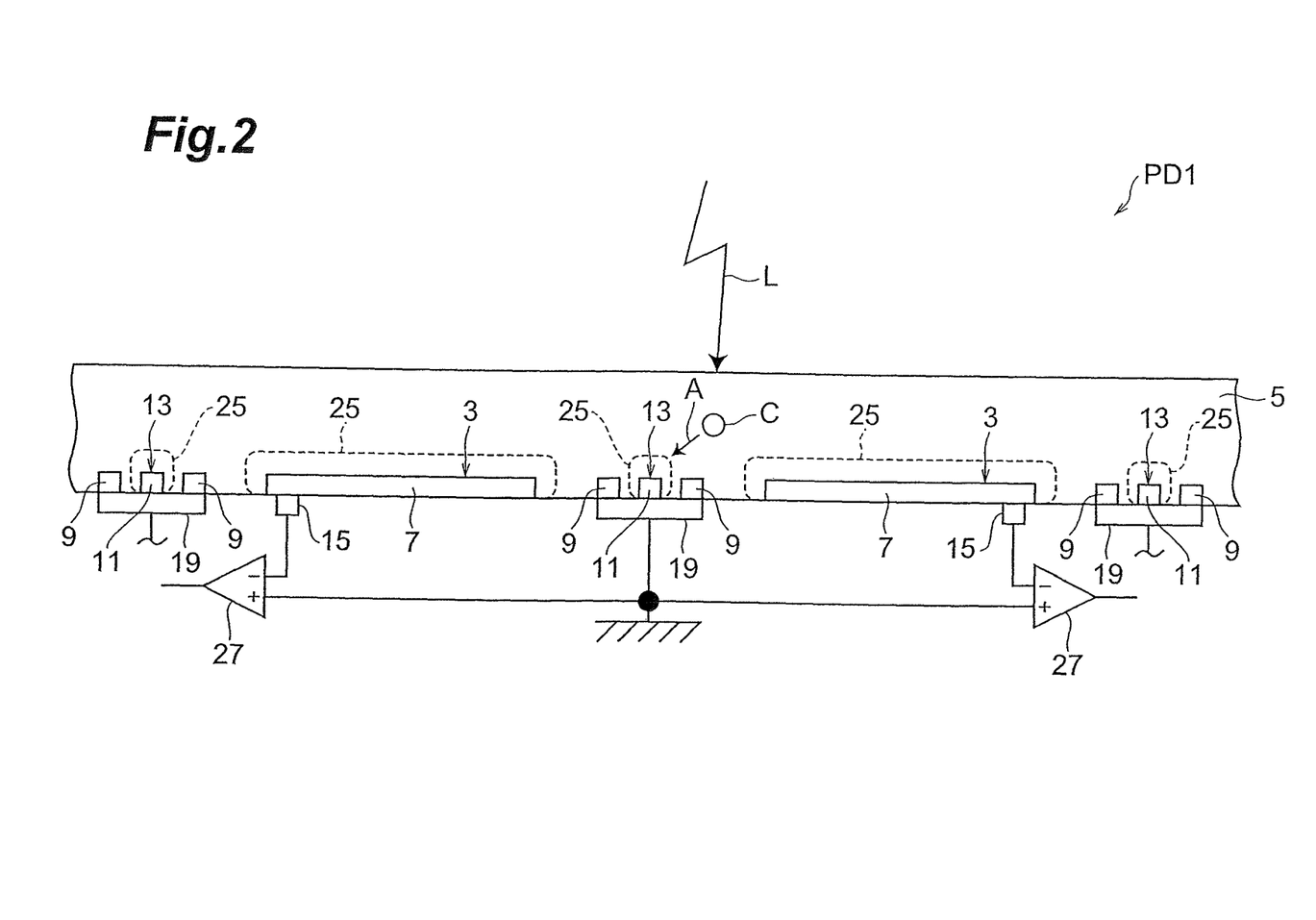
FIG. 2 is a diagram for explaining the cross-sectional structure taken along the line II-II of FIG. 1.

FIG. 1 is a schematic plan view showing the semiconductor photodetector in accordance with a first embodiment. FIG. 2 is a diagram for explaining the cross-sectional structure taken along the line II-II of FIG. 1. In the following explanation, the incident surface for light L (on the upper side in FIG. 1) will be referred to as backside, whereas the surface (on the lower side in FIG. 1) opposite therefrom will be referred to as front side.

A photodiode array PD1 as a semiconductor photodetector comprises a plurality of pn junction regions 3 two-dimensionally arranged into an array formed like a matrix with a regularity on the front side. Each of the pn junction regions 3 functions as a photosensitive pixel of a photodiode.

The photodiode array PD1 is provided with an n-type (first conductive type) semiconductor substrate 5 made of silicon (Si). Preferably, the n-type semiconductor substrate 5 has a thickness of 30 to 300 µm (preferably about 100 µm) and an impurity concentration of $1 \times 10^{12}$ to $10^{15}/cm^3$.

On the front side of the n-type semiconductor substrate 5, p-type (second conductive type) regions 7 are two-dimensionally arranged into an array formed like a matrix with a regularity. A pn junction region 3 formed between each p-type region 7 and the n-type semiconductor substrate 5 constitutes the photodiode. The p-type region 7 has an impurity concentration of $1 \times 10^{13}$ to $10^{20}/cm^3$, and a depth of 0.05 to 20 µm (preferably about 0.2 µm).

Disposed between the p-type regions 7 adjacent each other are a high-concentration n-type region (separation layer) 9 as a high-concentration impurity semiconductor region, and a p-type region 11.

The high-concentration n-type region 9 is formed by diffusing an n-type impurity from the front side of the substrate 5 so as to surround the p-type region 7 (photodiode) as seen from the front side. The high-concentration n-type region 9 has a function of electrically separating adjacent photodiodes from each other. Providing the high-concentration n-type region 9 can electrically separate the adjacent photodiodes for sure, thereby lowering the crosstalk between the photodiodes and regulating the breakdown voltage (reverse breakdown voltage). The high-concentration n-type region 9 has an impurity concentration of $1 \times 10^{13}$ to $10^{20}/cm^3$, and a thickness of 0.1 to several tens of µm (preferably about 3 µm).

The p-type region 11 is formed by diffusing a p-type impurity from the front side of the substrate 5 so as to surround the p-type region 7 (photodiode) and high-concentration n-type region 9 as seen from the front side. A pn junction region 13 is formed between each p-type region 11 and the n-type semiconductor substrate 5. Also, the high-concentration n-type region 9 is formed between the pn junction region 13 and the p-type region 7 (photodiode). The p-type region 11 has an impurity concentration of $1 \times 10^{13}$ to $10^{20}/cm^3$, and a depth of 0.05 to 20 µm (preferably about 0.2 µm).

For the p-type regions 7 located at end portions (chip edges) of the semiconductor substrate 5, it is not necessary to form the high-concentration n-type regions 9 and p-type regions 11 on the chip edge side, since there are no adjacent p-type regions 7 on the chip edge side.

Formed on the front side of the n-type semiconductor substrate 5 is a thermally oxidized film (not depicted) as a passivation film and electrically insulating film. Formed on the backside of the n-type semiconductor substrate 5 is an AR film (not depicted) for protecting the backside and suppressing the reflection of light L. On the backside of the n-type semiconductor substrate 5, the photodiode array PD1 is made substantially flat.

Formed on the front side of the n-type semiconductor substrate 5 are electrodes 15 electrically connected to the respective p-type regions 7. Each electrode 15 includes an electrode pad, an under-bump metal (UBM), and a bump electrode 17

(the electrode pad and UBM being undepicted). The electrode pad is made of an aluminum film, for example, and is electrically connected to its corresponding p-type region 7 through a contact hole formed in the thermally oxidized film. The UBM is formed, for example, by plating an electrode conductor with Ni and Au in succession. The bump electrode 17 is made of solder, and is formed on the UBM.

Electrodes 19 electrically connected to the high-concentration n-type regions 9 and p-type regions are formed on the front side of the n-type semiconductor substrate 5. Each electrode 19 includes an electrode conductor 21, a UBM (not depicted), and a bump electrode 23. The electrode conductor 21 is made of an aluminum film, for example, and is electrically connected to the high-concentration n-type region 9 and p-type region 11 through a contact hole formed in the thermally oxidized film. As is also illustrated by FIG. 2, the electrode conductor 21 is formed so as to cover the high-concentration n-type region 9 and p-type region 11 as seen from the front side of the n-type semiconductor substrate 5. The UBM is formed, for example, by plating the electrode conductor 21 with Ni and Au in succession. The bump electrode 23 is made of solder, and is formed on the UBM. The electrode 19 is connected to the ground potential.

In the photodiode array PD1, the anode extraction of each photodiode is realized by the electrode 15, whereas the cathode extraction is realized by the electrode 19. Also, in the photodiode array PD1, depletion layers 25 are formed in boundaries of the pn junction regions 3, 13.

When the light L to be detected is incident on the photodiode array PD1 from the backside, each photodiode generates a carrier corresponding to the incident light. The photocurrent caused by thus generated carrier is taken out from the electrode 15 (bump electrode 17) connected to the p-type region 7. As is also illustrated by FIG. 2, the output from the electrode 15 is connected to the inverting input terminal of a differential amplifier. The non-inverting input terminal of the differential amplifier 27 is connected to the ground potential in common with the electrode 19.

Figure 8:
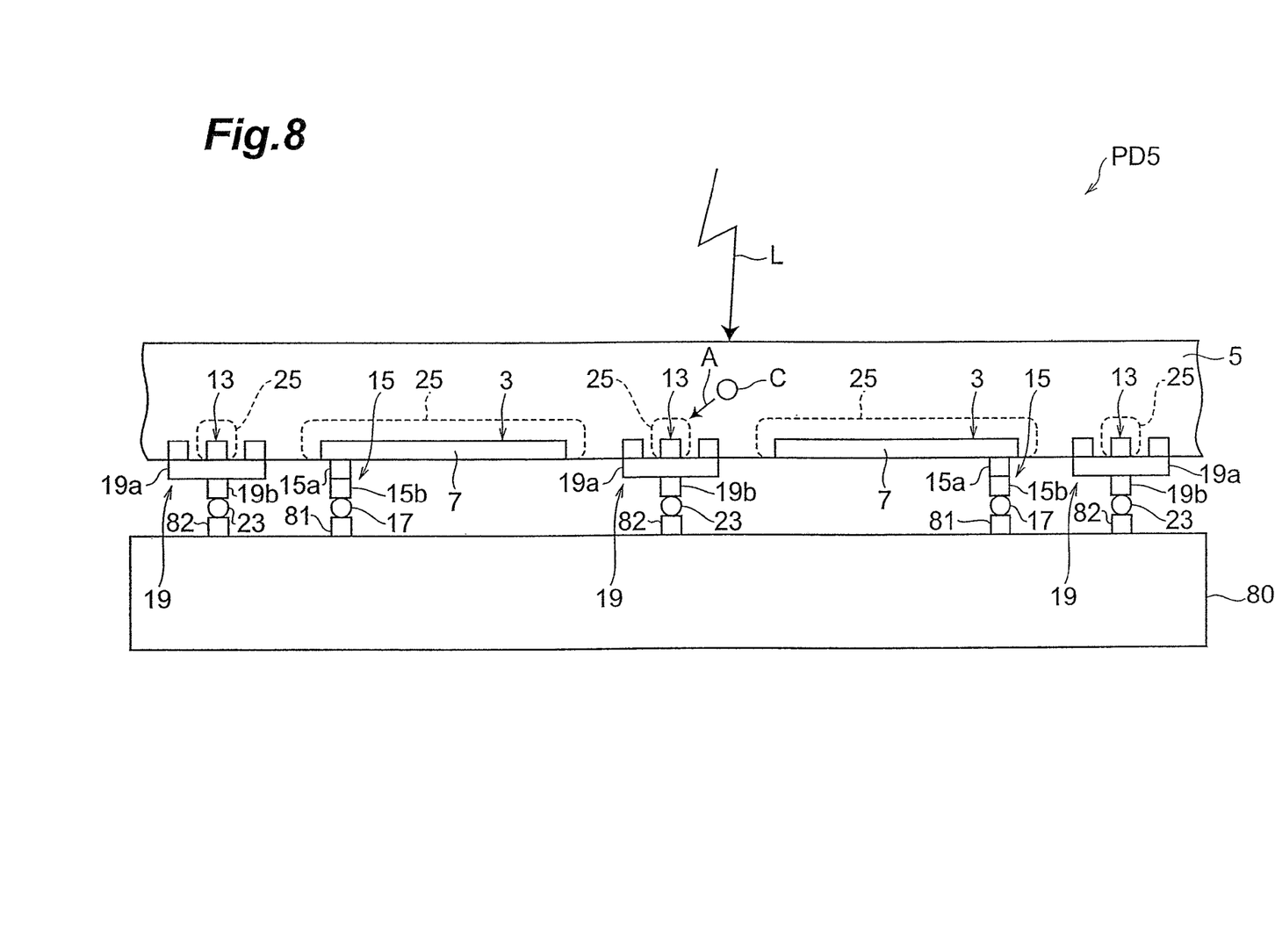
FIG. 8 is a diagram for explaining the cross-sectional structure of a modified example of the semiconductor photodetector shown in FIG. 2.

FIG. 8 is a diagram for explaining the cross-sectional structure of a modified example of the semiconductor photodetector shown in FIG. 2. Here, a photodiode array PD5 as a semiconductor photodetector comprises, in addition to a semiconductor substrate 5, a wiring board 80 as a support member for supporting the semiconductor substrate 5.

Formed on the front side of the semiconductor substrate 5 are electrodes 15 electrically connected to their corresponding p-type regions 7 as mentioned above. In the example shown in FIG. 8, each electrode 15 is constituted by an electrode pad 15a, a UBM 15b, and a bump electrode 17. Formed on the front side of the semiconductor substrate 5 are electrodes 19 electrically connected to their corresponding high-concentration n-type regions 9 and p-type regions 11. In the example shown in FIG. 8, each electrode 19 is constituted by an electrode pad 19a, a UBM 19b, and a bump electrode 23.

On the side of wiring board 80 facing the semiconductor substrate 5, with respect to the electrodes 15, 19 on the semiconductor substrate 5, electrode pads 81 are formed so as to correspond to the p-type regions 7 (photodiodes). As shown in FIG. 8, the p-type regions 7 of the semiconductor substrate 5 are electrically connected to their corresponding electrode pads 81 of the wiring board 80 by way of the bump electrodes 17 of the electrodes 15, respectively.

On the side of wiring board 80 facing the semiconductor substrate 5, electrode pads 82 are formed so as to correspond to the respective high-concentration n-type regions 9 and p-type regions 11. As shown in FIG. 8, the high-concentration n-type regions 9 and p-type regions 11 of the semiconductor substrate 5 are electrically connected to their corresponding electrode pads 82 of the wiring board 80 by way of the bump electrodes 23 of the electrodes 19.

In the first embodiment, as in the foregoing, the p-type regions 11 (pn junction regions 13) are formed between p-type regions 7 (photodiodes) adjacent each other among a plurality of p-type regions on the front side of the n-type semiconductor substrate 5. As a consequence, even when a carrier C occurs in the vicinity of the adjacent p-type regions 7, in regions other than the depletion layers 25 in the n-type semiconductor substrate 5, the carrier C that is about to flow into the adjacent p-type regions 7 by migrating upon diffusion is drawn from the p-type region 11 as indicated by arrow A in FIG. 2. As a result, the carrier C that is about to flow into the adjacent p-type regions 7 by migrating upon diffusion is eliminated, whereby crosstalk can favorably be restrained from occurring between the p-type regions 7.

In the backside illumination type photodiode array PD1 in which the light L is incident on the backside, as FIG. 8 exemplifies its connecting structure, a bump connection employing bump electrodes is preferably used in the connection with respect to a support member such as wiring board. In such a configuration using a bump connection, a connecting point may be damaged because of an initial connection error, a temperature cycle, etc., whereby a p-type region 7 (photodiode) may fall into an electrically floating state.

In the photodiode array PD1 configured as mentioned above, by contrast, even when a certain p-type region 7 falls into an electrically floating state because of a breakage of a connecting point due to an initial connection error, a temperature cycle, etc., carriers overflowing the p-type region 7 are drawn from the p-type region 11. This can favorably restrain carriers from flowing into the adjacent p-type regions 7. This is also effective in cases employing connecting structures other than the bump connection.

In the first embodiment, each p-type region 11 is formed so as to surround its p-type region 7 as seen from the backside of the n-type semiconductor substrate 5. This certainly eliminates the carrier C that is about to flow into the adjacent p-type regions 7 by migrating upon diffusion, and thus can suppress the occurrence of crosstalk more favorably.

Also, even when a certain p-type region 7 falls into an electrically floating state because of a breakage of a connecting point, carriers overflowing the p-type region 7 are drawn from the p-type region 11 surrounding the p-type region 7. This can further favorably restrain carriers from flowing into adjacent p-type regions 7.

In the first embodiment, the high-concentration n-type regions 9 are formed between the p-type regions 7 and 11 on the front side of the n-type semiconductor substrate 5. This can electrically separate the adjacent p-type regions 7 from each other, thereby further lowering the crosstalk between the p-type regions 7. Also, even when a certain photodiode falls into an electrically floating state because of a breakage of a connecting point, the flow of carriers into adjacent photodiodes can further be reduced.

In the first embodiment, each high-concentration n-type region 9 is formed so as to surround its corresponding p-type region 7 as seen from the backside of the n-type semiconductor substrate 5. This can electrically separate the adjacent p-type regions 7 for sure.

In the first embodiment, the electrodes 19 electrically connected to the high-concentration n-type regions 9 and p-type regions 11 are formed on the front side of the n-type semiconductor substrate 5, and are connected to a ground potential. As a consequence, the same electrode can commonly be used for connecting both the p-type region 11 and high-concentration n-type region 9 to the ground potential, thereby preventing the number of electrodes from increasing. In this case, the carrier C drawn from the p-type region 11 disappears within the photodiode array PD1.

In the first embodiment, the p-type regions 11 can be formed in the same process as with the p-type regions 7. In this case, the process of making the photodiode array PD1 will not be complicated.

Second Embodiment

Figure 3:
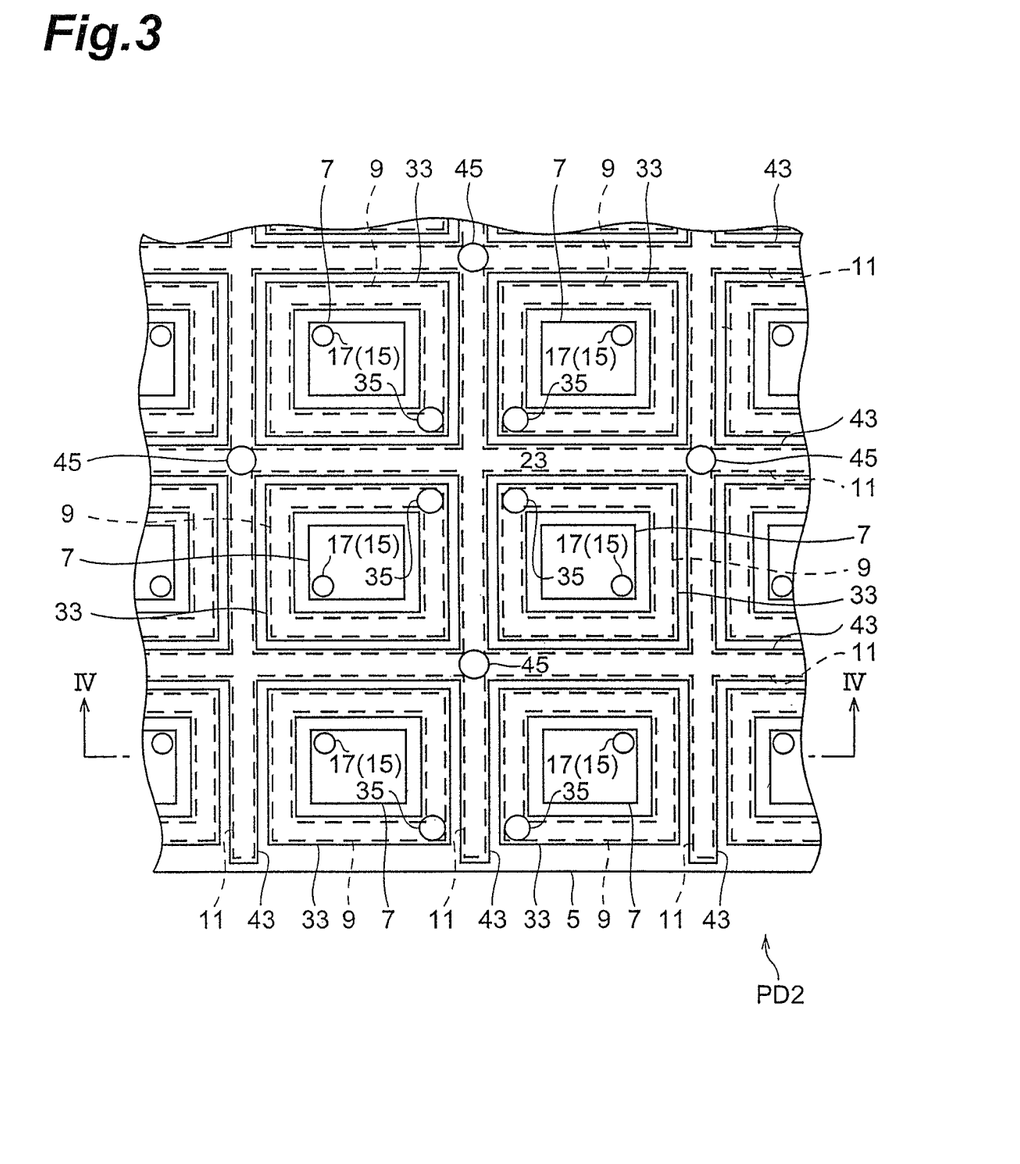
FIG. 3 is a schematic plan view showing the semiconductor photodetector in accordance with a second embodiment.
Figure 4:
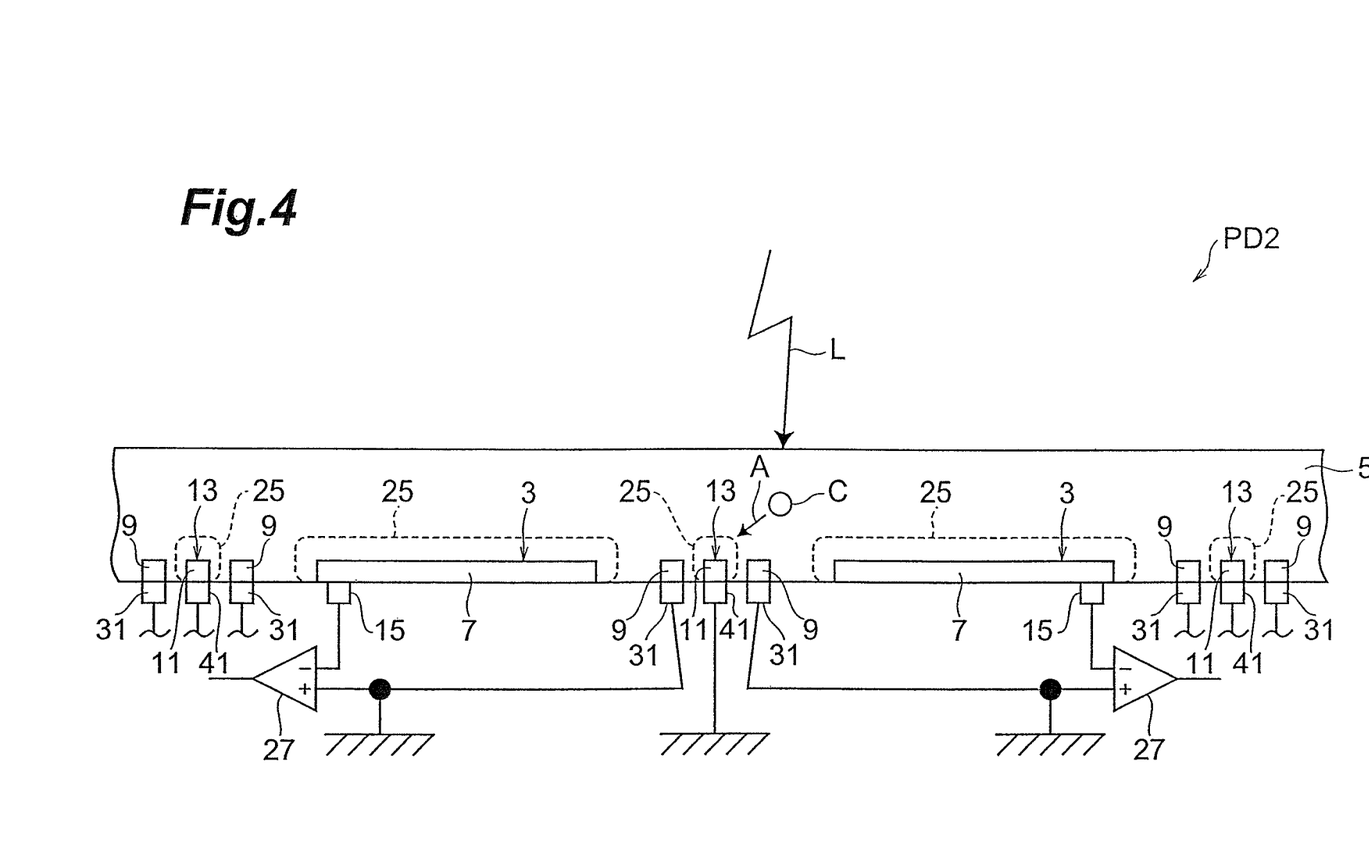
FIG. 4 is a diagram for explaining the cross-sectional structure taken along the line IV-IV of FIG. 3.

FIG. 3 is a schematic plan view showing the semiconductor photodetector in accordance with a second embodiment. FIG. 4 is a diagram for explaining the cross-sectional structure taken along the line IV-IV of FIG. 3. The photodiode array PD2 in accordance with the second embodiment differs from the photodiode array PD1 in accordance with the first embodiment in terms of electrode structures of high-concentration n-type regions 9 and p-type regions 11.

Formed on the front side of the n-type semiconductor substrate 5 are electrodes 31 (corresponding to the second electrode) electrically connected to their corresponding high-concentration n-type regions 9. Each electrode 31 includes an electrode conductor 33, a UBM (not depicted), and a bump electrode 35. The electrode conductor 33 is made of an aluminum film, for example, and is electrically connected to its corresponding high-concentration n-type region 9 through a contact hole formed in a thermally oxidized film. As is also shown in FIG. 4, the electrode conductor 33 is formed so as to cover the high-concentration n-type region 9 as seen from the front side of the n-type semiconductor substrate 5. The UBM is formed, for example, by plating the electrode conductor 33 with Ni and Au in succession. The bump electrode 35 is made of solder, and is formed on the UBM. The electrode 31 is connected to the non-inverting input terminal of a differential amplifier 27, whereas a middle part of a lead between the electrode 31 and the non-inverting input terminal of the differential amplifier 27 is connected to a ground potential. Therefore, the electrode 31 and the non-inverting input terminal of the differential amplifier 27 are connected to the common ground potential.

Formed on the front side of the n-type semiconductor substrate 5 are electrodes 41 (corresponding to the first electrode) electrically connected to their corresponding p-type regions 11. Each electrode 41 includes an electrode conductor 43, a UBM (not depicted), and a bump electrode 45. The electrode conductor 43 is made of an aluminum film, for example, and is electrically connected to its corresponding p-type region 11 through a contact hole formed in the thermally oxidized film. As is also shown in FIG. 2, the electrode conductor 43 is formed so as to cover its p-type region 11 as seen from the front side of the n-type semiconductor substrate 5. The UBM is formed, for example, by plating the electrode conductor 43 with Ni and Au in succession. The bump electrode 45 is made of solder, and is formed on the UBM. The electrodes 41 are electrically insulated from the electrodes 31. While being electrically insulated from the electrodes 31, the electrodes 41 are connected to a ground potential different from that of the electrodes 31 on the outside of the photodiode array PD2.

As explained in the foregoing, a carrier C which is about to flow into adjacent p-type regions 7 by migrating upon diffusion is drawn from a p-type region 11 in the second embodiment as in the first embodiment. This eliminates the carrier that is about to flow into the adjacent p-type regions 7 by migrating upon diffusion, and thus can favorably restrain crosstalk from occurring between the p-type regions 7.

Also, even when a certain p-type region 7 falls into an electrically floating state because of a breakage of a connecting point due to an initial connection error, a temperature cycle, etc., carriers overflowing the p-type region 7 are drawn from the p-type region 11. This can favorably restrain carriers from flowing into the adjacent p-type regions 7.

Also, in the second embodiment, the electrodes 31 electrically connected to their corresponding high-concentration n-type regions 9 and the electrodes 41 electrically connected to their corresponding p-type regions 11 are formed on the front side of the n-type semiconductor substrate 5. While being electrically insulated from each other, the electrodes 31 and 41 are connected to the respective ground potentials different from each other. In this configuration, the high-concentration n-type regions 9 and p-type regions 11 are electrically separated from each other within the Photodiode array PD2. As a consequence, even when the ground potential varies, for example, the potential of the p-type regions 11 does not fluctuate, whereby currents can be restrained from flowing in because of the potential difference between the p-type regions 7 and 11. As a result, output signals from the p-type regions 7 are less likely to be electrically affected (by noise superposition), whereby a stable signal output can be realized.

In the second embodiment, the p-type regions 11 can be formed in the same process as with the p-type regions 7, whereas the electrodes 41 can be formed by the same process as with the electrodes 31 and 15. In this case, the process of making the photodiode array PD2 will not be complicated.

Since the electrodes 31 and 41 are electrically insulated from each other, it is easy to apply a reverse bias voltage in the photodiode array PD2. Therefore, when an integrating amplifier is used for detecting signals, low signals can easily be detected.

Figure 5:
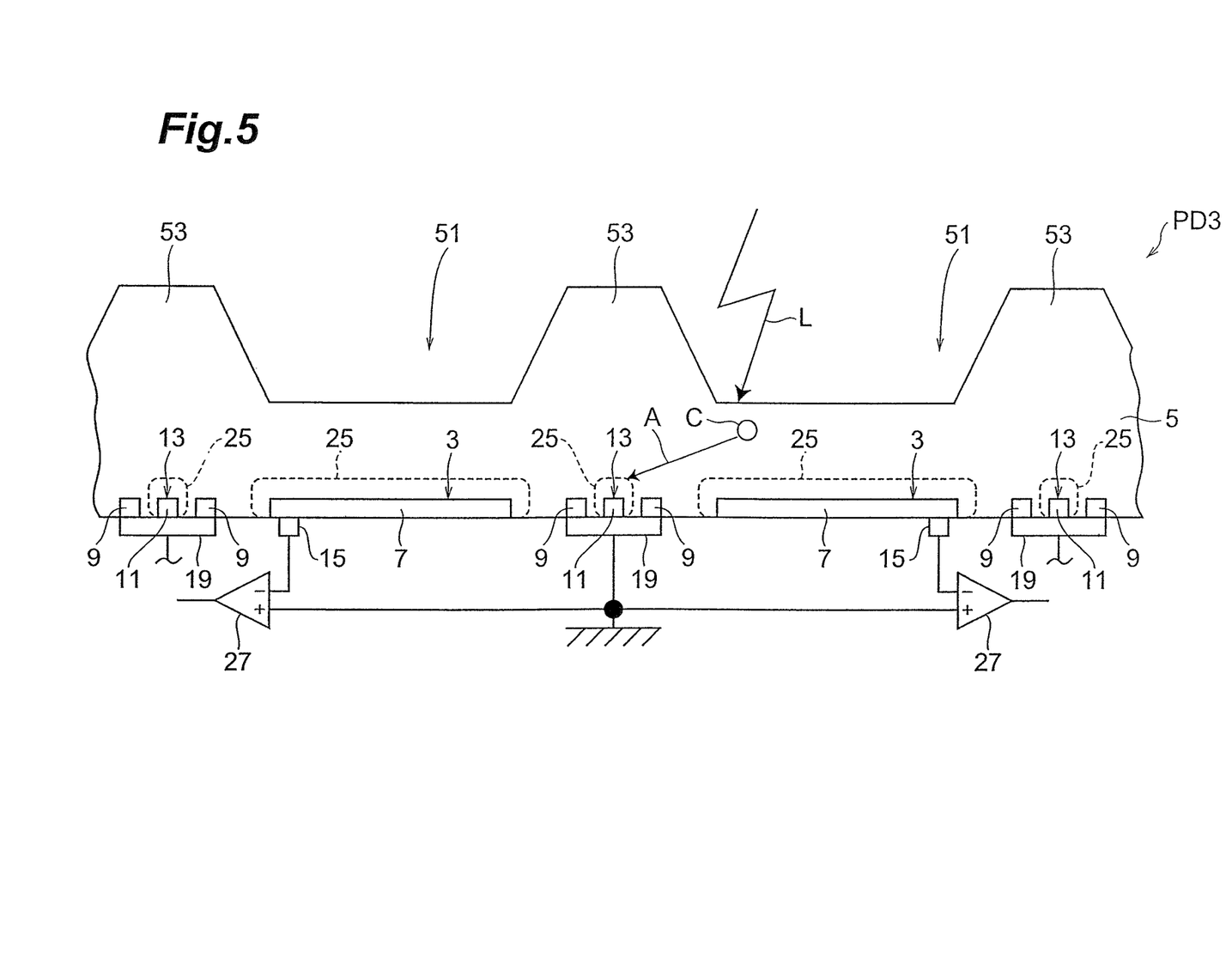
FIG. 5 is a diagram for explaining the cross-sectional structure of a modified example of the semiconductor photodetector in accordance with the embodiments.
Figure 6:
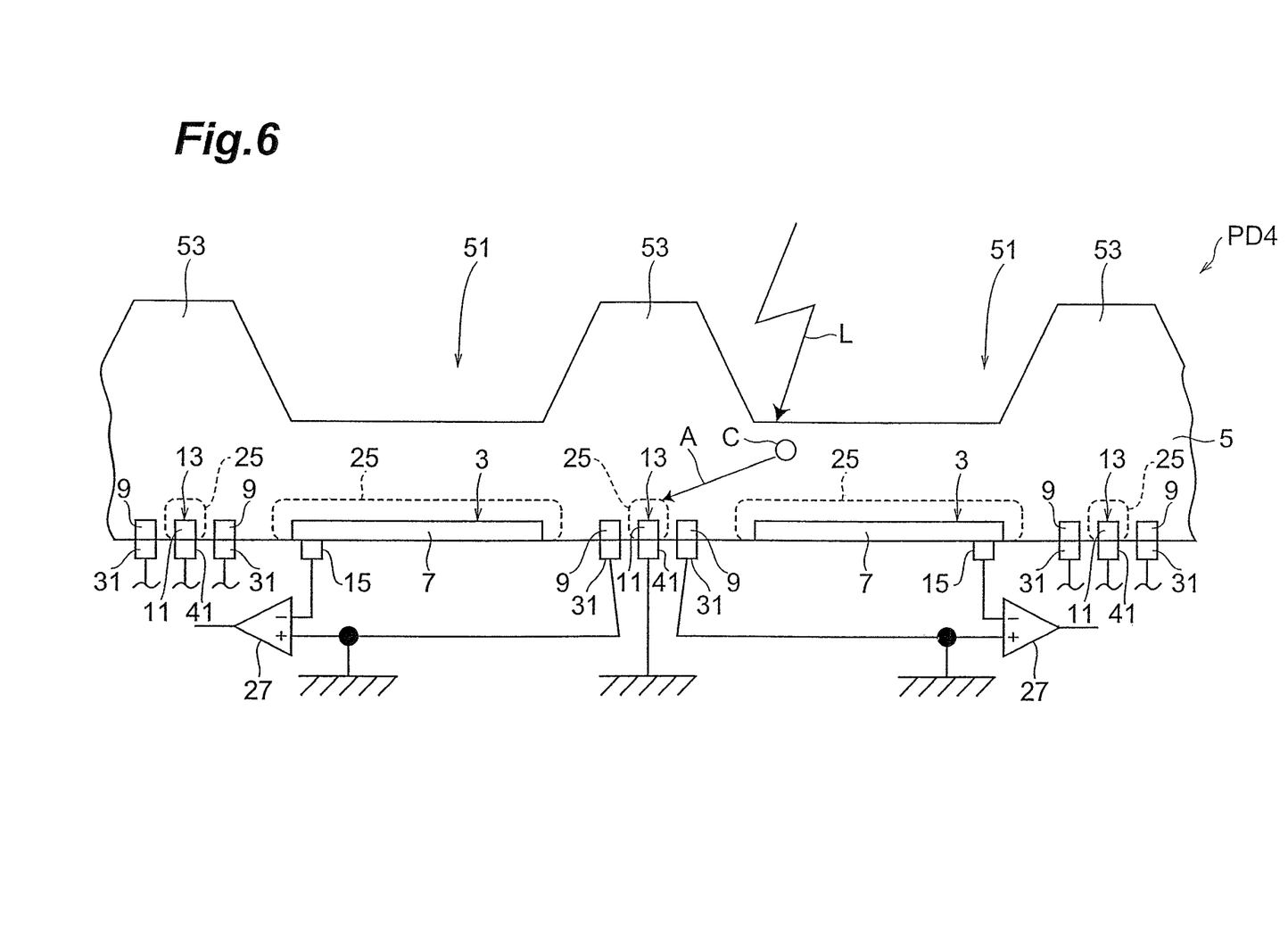
FIG. 6 is a diagram for explaining the cross-sectional structure of a modified example of the semiconductor photodetector in accordance with the embodiments.

With reference to FIGS. 5 and 6, modified examples of the semiconductor photodetector in accordance with these embodiments will be explained. FIGS. 5 and 6 are diagrams for explaining the respective cross-sectional structures of modified examples of the semiconductor photodetector in accordance with the above-mentioned embodiments.

The photodiode array PD3 as a semiconductor photodetector shown in FIG. 5 differs from the photodiode array PD1 in accordance with the first embodiment in terms of the form of the n-type semiconductor substrate 5. The photodiode array PD4 as a semiconductor photodetector shown in FIG. 6 differs from the photodiode array PD2 in accordance with the second embodiment in terms of the form of the n-type semiconductor substrate 5.

In each of the photodiode arrays PD3, PD4, recesses 51 are formed in respective areas corresponding to the pn junction regions 3 (p-type regions 7) on the backside of the n-type semiconductor substrate 5. As a consequence, in areas corresponding to spaces between the adjacent p-type regions 7, protrusions 53 are formed so as to surround the respective areas corresponding to the p-type regions 7.

In the photodiode arrays PD3, PD4, as in the above-mentioned embodiments, carriers C which are about to flow into the adjacent p-type regions 7 by migrating upon diffusion are eliminated, whereby the occurrence of crosstalk between the p-type regions 7 can favorably be suppressed.

Also, even when a certain p-type region 7 falls into an electrically floating state because of a breakage of a connecting point due to an initial connection error, a temperature cycle, etc., carriers overflowing the p-type region 7 are drawn from the p-type region 11. This can favorably restrain carriers from flowing into adjacent p-type regions 7.

The photodiode arrays PD3, PD4 can shorten the distance from the surface of the n-type semiconductor substrate 5 (i.e., the incident surface for light L) to the pn junction region 3, while keeping a mechanical strength. Since the distance from the surface of the n-type semiconductor substrate 5 to the pn junction region 3 is short, the carriers C generated in the n-type semiconductor substrate 5 are restrained from recombining in the process of migrating to the pn junction region 3.

Figure 7:
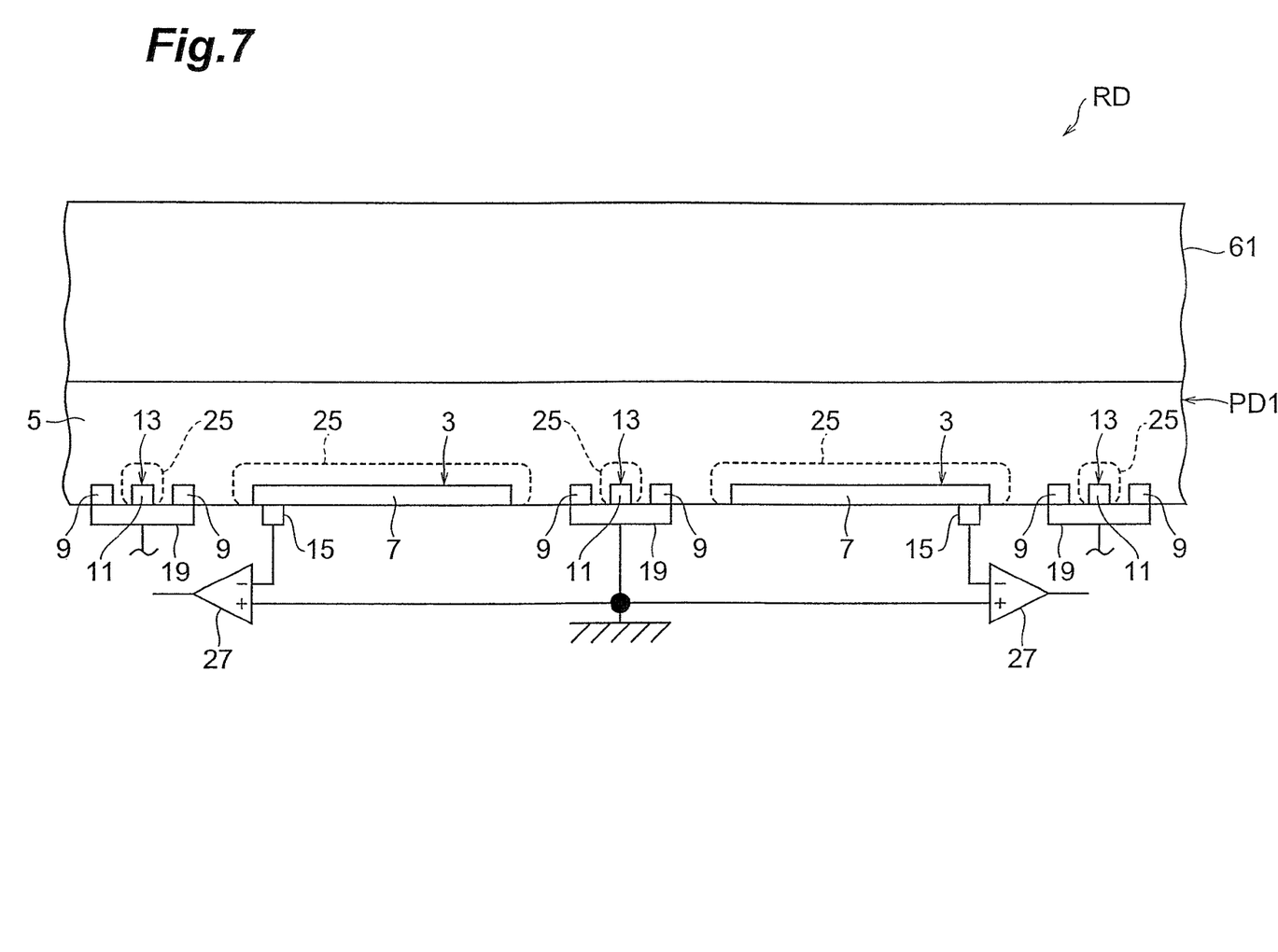
FIG. 7 is a diagram for explaining the cross-sectional structure of the radiation detecting apparatus in accordance with an embodiment.

With reference to FIG. 7, the radiation detecting apparatus in accordance with an embodiment will now be explained. FIG. 7 is a diagram for explaining the cross-sectional structure of the radiation detecting apparatus in accordance with this embodiment.

This radiation detecting apparatus RD comprises a scintillator 61 adapted to emit light in response to a radiation incident thereon, and the above-mentioned photodiode array PD1. In place of the photodiode array PD1, the photodiode arrays PD2 to PD4 may be used as well.

The scintillator 61 is positioned on the backside of the photodiode array PD1. The light emitted from the scintillator 61 enters the photodiode array PD1 from the backside thereof. The scintillator is bonded to the backside of the photodiode array PD1. For bonding the scintillator 61 and the photodiode array PD1 together, a light-transparent resin (e.g., epoxy resin or acrylic resin) can be used.

The radiation detecting apparatus RD comprises the photodiode array PD1, thereby favorably suppressing the occurrence of crosstalk between the p-type regions 7. Also, even when a certain photodiode falls into an electrically floating state because of a breakage of a connecting point due to an initial connection error, a temperature cycle, etc., carriers are favorably restrained from flowing into adjacent photodiodes. This can achieve a high resolution.

The present invention is not restricted to the above-mentioned embodiments. For example, though the present invention is employed in photodiode arrays in which a plurality of pn junctions are two-dimensionally arranged into a matrix with a regularity in the above-mentioned embodiments, they are not restrictive. The present invention can also be employed in photodiode arrays in which pn junctions are arranged one-dimensionally.

The photodiode arrays PD1 to PD4 and radiation detecting apparatus RD in accordance with the above-mentioned embodiments are suitable for X-ray CT apparatus.

The present invention can provide semiconductor photodetectors and radiation detecting apparatus which can favorably restrain crosstalk from occurring. Also, the present invention can provide semiconductor photodetectors and radiation detecting apparatus in which, even when a certain photodiode falls into an electrically floating state because of a breakage of a connecting point due to an initial connection error, a temperature cycle, etc., carriers are favorably restrained from flowing into adjacent photodiodes.

What is claimed is:

1. A semiconductor photodetector comprising:
a semiconductor substrate formed with a plurality of pn junction type photodiodes on a side of the semiconductor substrate opposite from an incident surface of the semiconductor substrate for receiving light to be detected;
wherein, on the side of the semiconductor substrate opposite from the incident surface, a separate region including a pn junction, which is separate from the photodiodes, is formed between photodiodes adjacent each other in the plurality of photodiodes, and a high-concentration impurity semiconductor region having the same conductivity type as that of the semiconductor substrate, which is separate from the photodiodes and the separate region, is formed between the separate region and each of the photodiodes closest to the separate region,
the separate region is disposed so as to be sandwiched between the high-concentration impurity semiconductor regions,
the high-concentration impurity semiconductor region has an impurity concentration higher than that of the semiconductor substrate and is formed so as to surround the photodiode as seen from the side of the semiconductor substrate opposite from the incident surface,
the semiconductor substrate and the high-concentration impurity semiconductor region are of a first conductivity type,
a first electrode electrically connected to a second conductivity type impurity semiconductor region constituting the separate region with the semiconductor substrate, and a second electrode electrically connected to the high-concentration impurity semiconductor region are formed on the side of the semiconductor substrate opposite from the incident surface, the second conductivity type being opposite to the first conductivity type,
a portion of the semiconductor substrate is disposed between the second conductivity type impurity semiconductor region and the high-concentration impurity semiconductor region, and
wherein the first and second electrodes are electrically insulated from each other.

2. The semiconductor photodetector according to claim 1, wherein the separate region is formed so as to surround at least one of the photodiodes as seen from the side of the semiconductor substrate opposite from the incident surface.

3. The semiconductor photodetector according to claim 1, wherein the side of the semiconductor substrate opposite from the incident surface is formed with respective electrodes, each including a bump electrode, electrically connected to the plurality photodiodes, wherein
the semiconductor photodetector further comprises a support member formed with respective electrode pads, formed on a side facing the semiconductor substrate, corresponding to the plurality of photodiodes, and the plurality of photodiodes are electrically connected to the electrode pads corresponding thereto in the support member by way of the respective bump electrodes.

4. The semiconductor photodetector according to claim 1, wherein the thickness of the high-concentration impurity semiconductor region is greater than the depth of the second conductivity type impurity semiconductor region constituting the separate region with the semiconductor substrate.

5. A radiation detecting apparatus comprising the semiconductor photodetector according to claim 1; and
a scintillator, positioned on the incident surface side of the semiconductor substrate, emitting tight in response to a radiation incident thereon.

* * * * *